(12) United States Patent
Kato

(10) Patent No.: US 10,063,765 B2
(45) Date of Patent: Aug. 28, 2018

(54) IMAGE PICKUP APPARATUS AND CAMERA

(71) Applicant: CANON KABUSHIKI KAISHA, Tokyo (JP)

(72) Inventor: Taro Kato, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 106 days.

(21) Appl. No.: 15/358,510

(22) Filed: Nov. 22, 2016

(65) Prior Publication Data

US 2017/0180628 A1  Jun. 22, 2017

(30) Foreign Application Priority Data

Dec. 17, 2015 (JP) ................ 2015-246633

(51) Int. Cl.
| | |
|---|---|
| H04N 5/232 | (2006.01) |
| H04N 5/369 | (2011.01) |
| H01L 27/146 | (2006.01) |
| H04N 5/225 | (2006.01) |
| H04N 5/378 | (2011.01) |

(52) U.S. Cl.
CPC ... *H04N 5/23212* (2013.01); *H01L 27/14627* (2013.01); *H04N 5/2254* (2013.01); *H04N 5/3696* (2013.01); *H04N 5/378* (2013.01)

(58) Field of Classification Search
CPC .............. H04N 5/23212; H04N 5/3696; H01L 27/14625; H01L 27/14627
See application file for complete search history.

(56) References Cited

U.S. PATENT DOCUMENTS

| | | | |
|---|---|---|---|
| 7,978,255 B2 | 7/2011 | Suzuki | |
| 8,514,309 B2 | 8/2013 | Kato et al. | |
| 8,670,051 B2 | 3/2014 | Kato | |
| 8,885,082 B2 | 11/2014 | Noda et al. | |
| 8,953,085 B2* | 2/2015 | Ui ...................... | G03B 13/36 |
| | | | 348/335 |

(Continued)

FOREIGN PATENT DOCUMENTS

| | | |
|---|---|---|
| JP | 2008-071972 A | 3/2008 |
| JP | 2009-109965 A | 5/2009 |

OTHER PUBLICATIONS

Hiroshi Ikakura, et al., U.S. Appl. No. 15/272,738, filed Sep. 22, 2016.

*Primary Examiner* — Daniel M Pasiewicz
(74) *Attorney, Agent, or Firm* — Fitzpatrick, Cella, Harper & Scinto

(57) ABSTRACT

An image pickup apparatus including a focus detection pixel configured to perform focus detection by a phase difference method, is provided. The focus detection pixel comprises a photoelectric conversion unit arranged in a substrate, a microlens arranged above the photoelectric conversion unit, and a light guide arranged between the photoelectric conversion unit and the microlens. A refracting power of the microlens on a first plane is smaller than a refracting power of the microlens on a second plane. The first plane passes through a top of the microlens, is perpendicular to an upper surface of the substrate, and is located along a direction in which the focus detection pixel performs the focus detection. The second plane passes through the top of the microlens, is perpendicular to the upper surface of the substrate, and intersects the first plane.

20 Claims, 13 Drawing Sheets

(56) References Cited

U.S. PATENT DOCUMENTS

| | | | |
|---|---|---|---|
| 9,093,345 B2 | 7/2015 | Kato et al. | |
| 9,478,575 B2 | 10/2016 | Kato | |
| 2006/0027825 A1* | 2/2006 | Kuriyama | H01L 27/14627 257/98 |
| 2013/0161774 A1* | 6/2013 | Okigawa | G02B 3/0056 257/432 |
| 2014/0035086 A1 | 2/2014 | Kato | |
| 2015/0009367 A1* | 1/2015 | Kobayashi | G02B 7/34 348/240.3 |
| 2015/0285955 A1* | 10/2015 | Iwakura | G02B 1/11 348/360 |
| 2015/0350529 A1* | 12/2015 | Kato | H04N 5/3696 348/345 |
| 2016/0071896 A1* | 3/2016 | Kawabata | H01L 27/14627 348/294 |
| 2016/0218127 A1 | 7/2016 | Kato et al. | |
| 2017/0077163 A1* | 3/2017 | Chou | H01L 27/14627 |
| 2017/0077164 A1* | 3/2017 | Kawabata | H01L 27/14627 |
| 2017/0094210 A1* | 3/2017 | Galor Gluskin | H04N 5/3696 |

\* cited by examiner

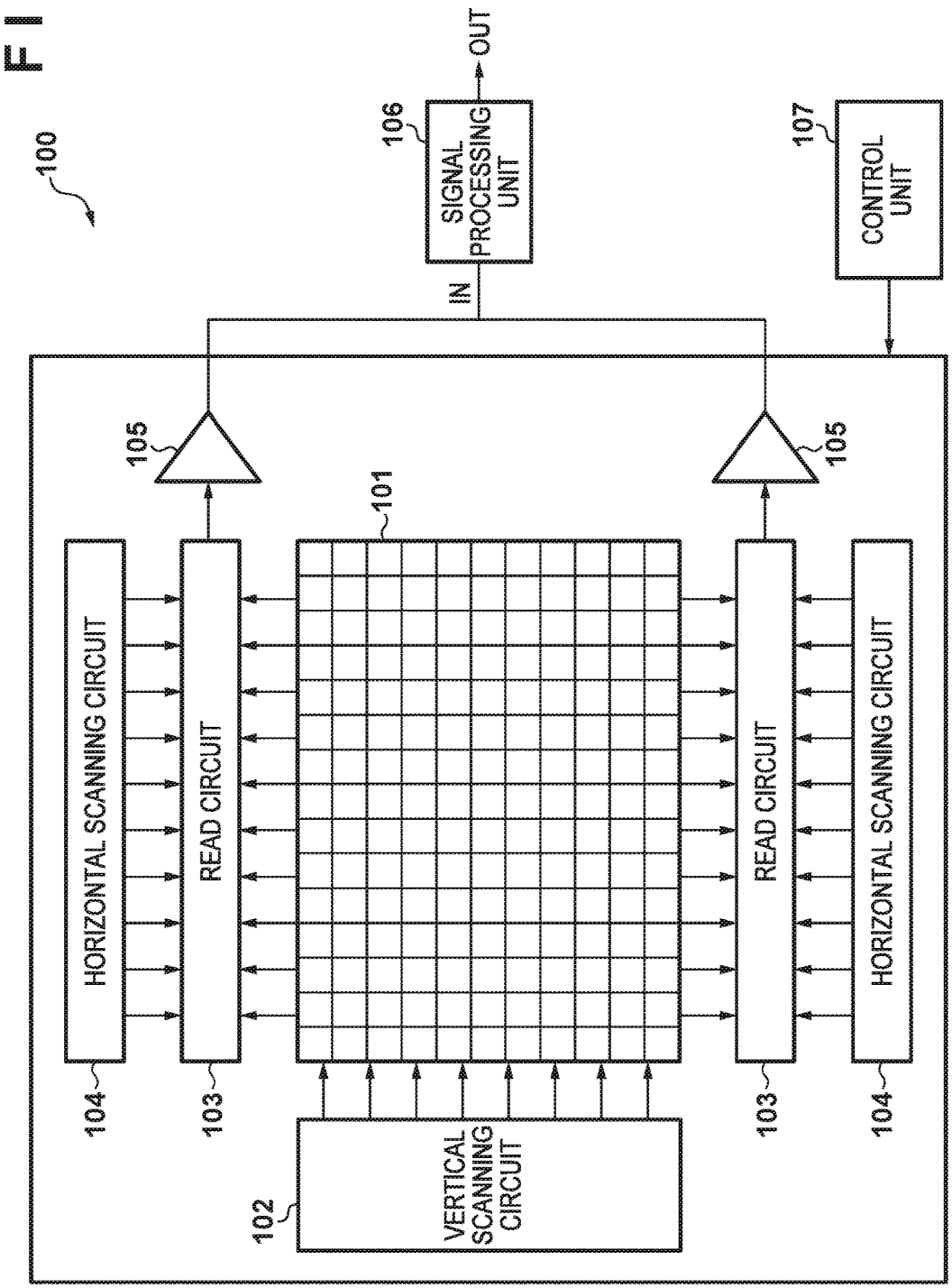

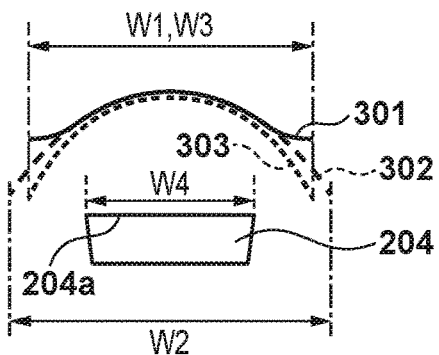
F I G. 3A
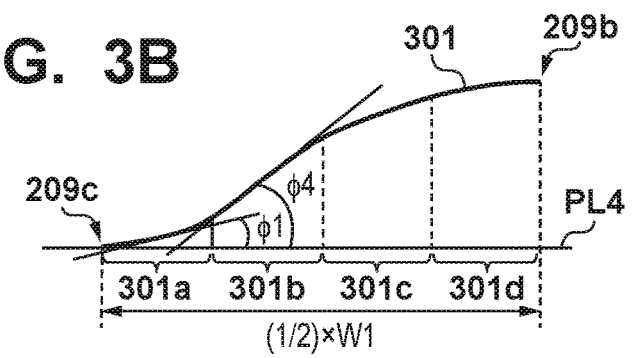
F I G. 3B
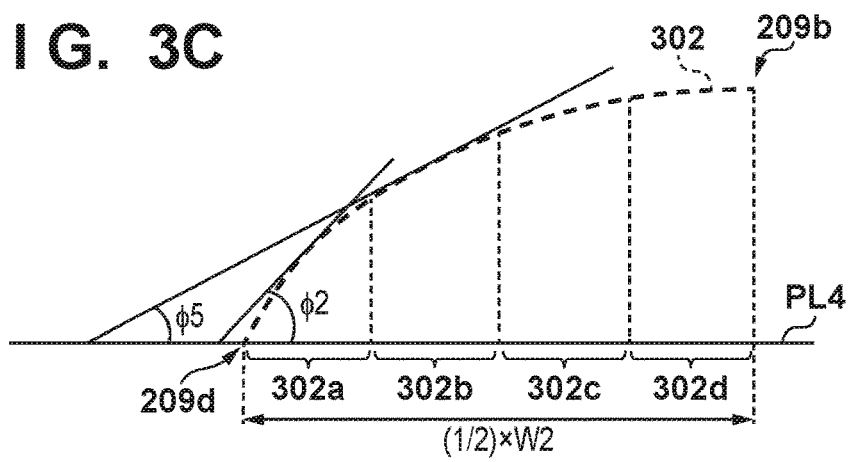
F I G. 3C
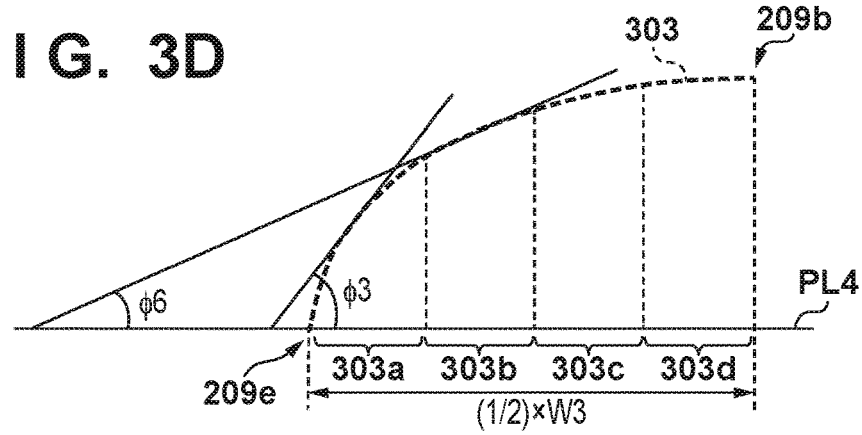
F I G. 3D

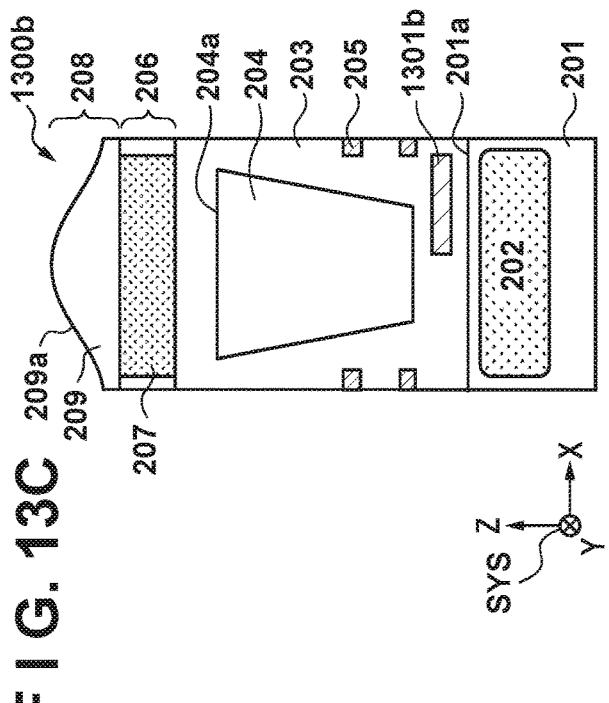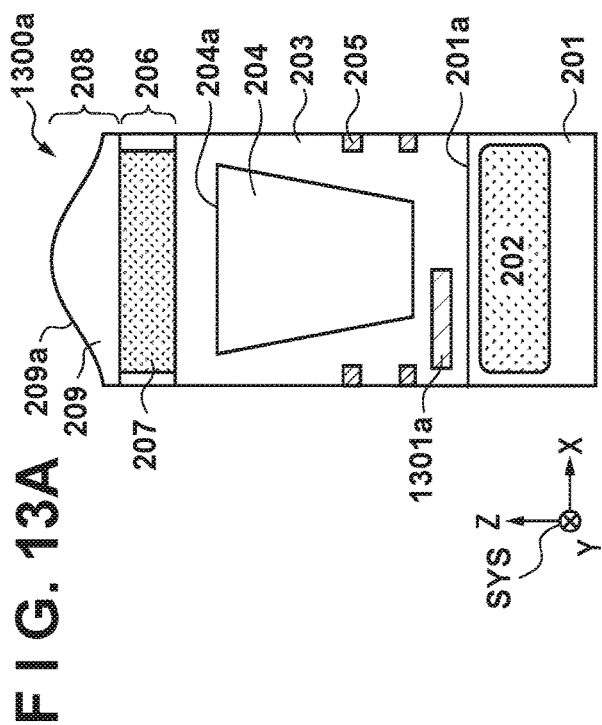

IMAGE PICKUP APPARATUS AND CAMERA

BACKGROUND OF THE INVENTION

Field of the Invention

The present invention relates to an image pickup apparatus and a camera.

Description of the Related Art

In recent years, an image pickup apparatus used in a video camera or an electronic still camera has become widespread. Image pickup apparatuses described in Japanese Patent Laid-Open Nos. 2008-71972 and 2009-109965 include pixels configured to do focus detection by a phase difference method. The focus detection pixel of these documents does not have a light guide between a microlens and a photoelectric conversion unit.

SUMMARY OF THE INVENTION

To improve sensitivity in a focus detection pixel, a light guide may be arranged between a microlens and a photoelectric conversion unit. If a light guide is arranged, it is difficult to simultaneously attain improvement of focus detection accuracy and improvement of sensitivity by the shape of the microlens described in Japanese Patent Laid-Open Nos. 2008-71972 and 2009-109965. An aspect of the present invention provides a technique of simultaneously attaining improvement of focus detection accuracy and improvement of sensitivity in a focus detection pixel including a light guide and a microlens.

According to some embodiments, an image pickup apparatus including a focus detection pixel configured to perform focus detection by a phase difference method, is provided. The focus detection pixel comprises a photoelectric conversion unit arranged in a substrate, a microlens arranged above the photoelectric conversion unit, and a light guide arranged between the photoelectric conversion unit and the microlens. A refracting power of the microlens on a first plane is smaller than a refracting power of the microlens on a second plane. The first plane passes through a top of the microlens, is perpendicular to an upper surface of the substrate, and is located along a direction in which the focus detection pixel performs the focus detection. The second plane passes through the top of the microlens, is perpendicular to the upper surface of the substrate, and intersects the first plane.

Further features of the present invention will become apparent from the following description of exemplary embodiments (with reference to the attached drawings).

BRIEF DESCRIPTION OF THE DRAWINGS

FIG. 1 is a view for explaining an example of the arrangement of an image pickup apparatus according to some embodiments;

FIGS. 3A to 3D are views for explaining an example of the arrangement of a microlens according to some embodiments;

FIGS. 13A to 13D are views for explaining an example of the arrangement of a focus detection pixel according to some embodiments.

DESCRIPTION OF THE EMBODIMENTS

Figure 2A:
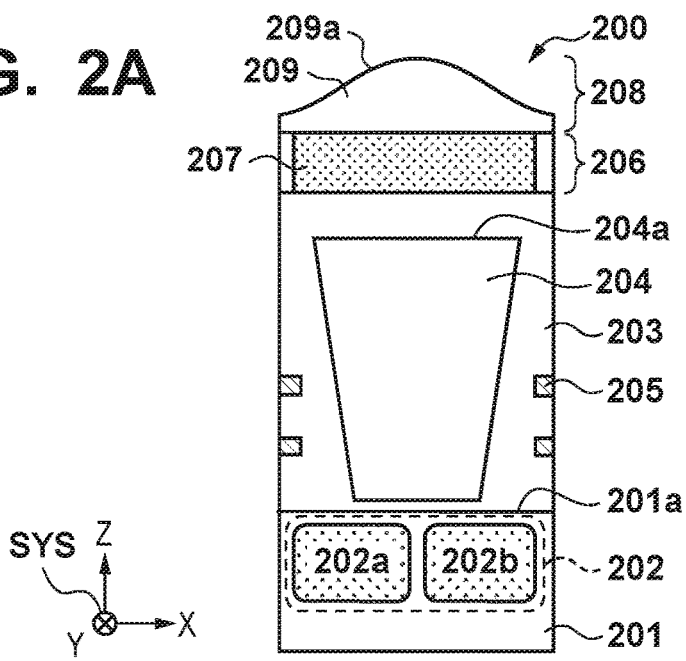
FIGS. 2A to 2C are views for explaining an example of the arrangement of a focus detection pixel according to some embodiments.

Embodiments of the present invention will now be described with reference to the accompanying drawings. The same reference numerals denote the same elements throughout the embodiments, and a repetitive description thereof will be omitted. The embodiments can appropriately be combined.

A block diagram of an image pickup apparatus 100 according to embodiments will be described with reference to FIG. 1. Existing components may be used as the constituent elements of the image pickup apparatus 100 to be explained with reference to FIG. 1. Hence, an example of the arrangement of the image pickup apparatus 100 will briefly be described below. The image pickup apparatus 100 includes an imaging region 101, a vertical scanning circuit 102, two read circuits 103, two horizontal scanning circuits 104, and two output amplifiers 105. A region of the image pickup apparatus 100 except the imaging region 101 can be called a peripheral circuit region. In the image pickup apparatus 100, a plurality of pixels are arranged in a two-dimensional array.

The vertical scanning circuit 102 selects a plurality of pixels on a row basis in accordance with an instruction from a control unit 107. The read circuit 103 includes a column amplifier, a correlated double sampling (CDS) circuit, an addition circuit, and the like, and performs addition, amplification, and the like for signals from the selected pixels in accordance with an instruction from the control unit 107. The horizontal scanning circuit 104 sequentially outputs the signals of one pixel row read by the read circuit 103 to the output amplifier 105 in accordance with an instruction from the control unit 107. The output amplifier 105 amplifies the signals supplied from the read circuit 103 and supplies the amplified signals to a signal processing unit 106.

The signal processing unit 106 performs focus detection or image generation using the signals supplied from the image pickup apparatus 100. The control unit 107 controls the operation of the entire image pickup apparatus 100. The signal processing unit 106 and the control unit 107 may be included in the image pickup apparatus 100, or may be included an electronic apparatus (for example, a camera) on which the image pickup apparatus 100 is mounted. The signal processing unit 106 and the control unit 107 may be implemented by executing a program by a processor such as a CPU, or may be implemented by hardware (for example, a circuit) such as an ASIC.

The structure of a focus detection pixel 200 will be described next with reference to FIGS. 2A to 2C. The focus detection pixel 200 is a pixel configured to do focus detection by a phase difference method. The image pickup apparatus 100 includes one or more focus detection pixels 200 in the imaging region 101. When the image pickup apparatus 100 includes a plurality of focus detection pixels 200, the focus detection pixels 200 may be distributively arranged in the imaging region 101, and may be one- or two-dimensionally arranged. The focus detection pixel 200 may be used exclusively for focus detection, or may be used not only for focus detection but also for image generation. The plurality of pixels may include an imaging pixel in addition to the focus detection pixel 200. The imaging pixel is a pixel that is not used to do focus detection but used to generate an image. The structure of the imaging pixel will be described later. As shown in FIG. 2A, the focus detection pixel 200 particularly includes a substrate 201 in which a photoelectric conversion unit 202 is arranged, a light guide 204, a color filter 207, and a microlens 209.

A coordinate system SYS is set to explain the shape of the focus detection pixel 200 below. The X direction of the coordinate system SYS is a direction parallel to an upper surface 201a of the substrate 201 and parallel to a direction to perform focus detection. The direction to perform focus detection is a direction in which the focus detection pixel 200 can detect a shift of focus. In the example shown in FIGS. 2A to 2C, the direction in which two photoelectric conversion regions 202a and 202b are arranged is the direction to perform focus detection. The Y direction of the coordinate system SYS is a direction parallel to the upper surface 201a of the substrate 201 and perpendicular to the X direction. The Z direction of the coordinate system SYS is a direction perpendicular to the upper surface 201a of the substrate 201, and light enters the focus detection pixel 200 from the positive side in the Z direction. The two photoelectric conversion regions 202a and 202b of the focus detection pixel 200 are arranged along the X direction. However, the image pickup apparatus 100 may include another focus detection pixel in which two photoelectric conversion regions are arranged along the Y direction.

Six planes are defined for the focus detection pixel 200. As shown in FIG. 2C, a plane that passes through a top 209b of the microlens 209 and is perpendicular to the upper surface 201a of the substrate 201 will be referred to as a plane PL1. The plane PL1 is parallel to the X-Z plane. A plane that passes through the top 209b of the microlens 209, is perpendicular to the upper surface 201a of the substrate 201, and intersects the plane PL1 will be referred to as a plane PL2. A plane that passes through the top 209b of the microlens 209 and is perpendicular to the plane PL1 and the upper surface 201a of the substrate 201 will be referred to as a plane PL3. The plane PL3 is parallel to the Y-Z plane. The plane PL2 intersects the plane PL3.

Figure 2B:
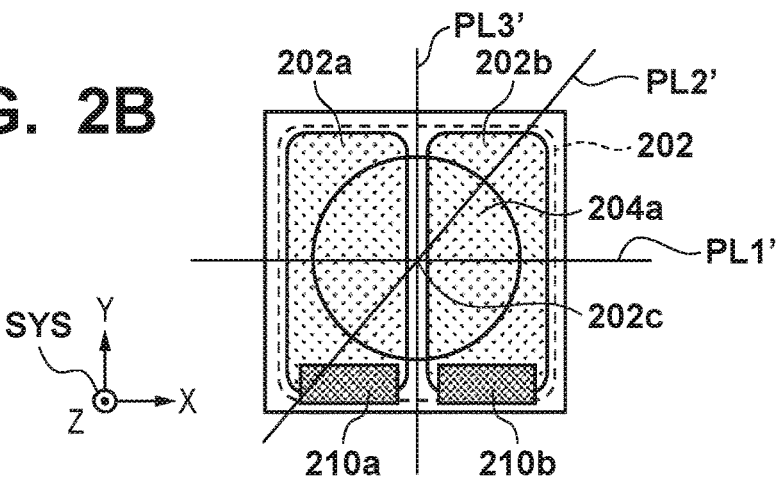
Figure 2C:
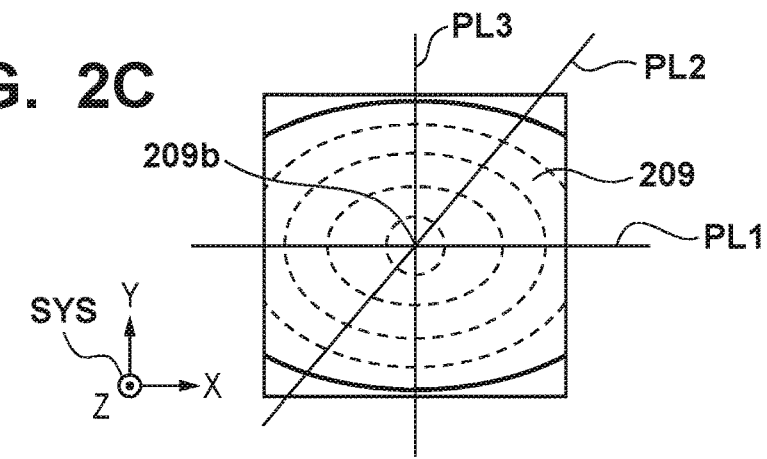

As shown in FIG. 2B, a plane that passes through a center 202c of the photoelectric conversion unit 202 and is perpendicular to the upper surface 201a of the substrate 201 will be referred to as a plane PL1'. The plane PL1' is parallel to the X-Z plane. A plane that passes through the center 202c of the photoelectric conversion unit 202, is perpendicular to the upper surface 201a of the substrate 201, and intersects the plane PL1' will be referred to as a plane PL2'. The plane PL2' is defined to be coincident with or parallel to the plane PL2. A plane that passes through the center 202c of the photoelectric conversion unit 202 and is perpendicular to the plane PL1' and the upper surface 201a of the substrate 201 will be referred to as a plane PL3'. The plane PL3' is parallel to the Y-Z plane. The plane PL2' intersects the plane PL3'. The center 202c is, for example, the geometric center of gravity of the photoelectric conversion unit 202 on a plane parallel to the upper surface 201a of the substrate 201.

In this embodiment, the top 209b of the microlens 209 matches the center 202c of the photoelectric conversion unit 202 in the Z direction. For this reason, the planes PL1, PL2, and PL3 are the same as the planes PL1', PL2', and PL3', respectively. In an embodiment in which the top 209b of the microlens 209 does not match the center 202c of the photoelectric conversion unit 202 in the Z direction, these planes are not the same. FIG. 2A is a sectional view of the focus detection pixel 200 taken along the plane PL1. FIG. 2B shows the upper surfaces of the photoelectric conversion regions 202a and 202b, gate electrodes 210a and 210b, and the light guide 204 viewed from the Z direction. FIG. 2C shows the microlens 209 viewed from the Z direction. In FIG. 2C, the broken lines indicate contour lines at heights from the upper surface 201a of the substrate 201.

The photoelectric conversion unit 202 is a semiconductor region arranged in the substrate 201. The conductivity type of the photoelectric conversion unit 202 is opposite to that of a portion around the photoelectric conversion unit 202. In this embodiment, the photoelectric conversion unit 202 is formed from the two photoelectric conversion regions 202a and 202b. The two photoelectric conversion regions 202a and 202b are electrically separated from each other. For example, an impurity region having a conductivity type opposite to that of the photoelectric conversion regions 202a and 202b may be arranged between the two photoelectric conversion regions 202a and 202b. Instead, an element isolation region may be arranged. As described above, the photoelectric conversion unit 202 has a shape symmetric with respect to the center 202c. The photoelectric conversion unit 202 also has a shape symmetric with respect to each of the planes PL1' and PL3'. The photoelectric conversion regions 202a and 202b are located on opposite sides of the plane PL3'. The gate electrodes 210a and 210b constitute transfer transistors configured to transfer charges generated in the photoelectric conversion regions 202a and 202b, respectively. The gate electrodes 210a and 210b have shapes symmetric with respect to the plane PL3'.

An insulating layer 203 is provided on the substrate 201. The insulating layer 203 may be able to pass visible light. The insulating layer 203 may be a single film made of one material, or may be a stacked film made of a plurality of materials that are different from each other. Examples of the materials of the insulating layer 203 are silicon oxide ($SiO_2$), silicon nitride ($Si_3N_4$), and silicon carbide (SiC). For example, the insulating layer 203 may be a single film of silicon oxide, or may be a stacked film of silicon oxide, silicon nitride, and silicon carbide. The insulating layer 203 incorporates a wiring pattern 205. The wiring pattern 205 may have a single-layered structure or, may have a multi-layered structure (FIGS. 2A to 2C show an example of a two-layered structure).

The image pickup apparatus 100 includes, on the insulating layer 203, a color filter layer 206 across the imaging region 101, and also includes, on the color filter layer, a microlens layer 208 across the imaging region 101. Each focus detection pixel 200 has the color filter 207 in the color filter layer 206. The color filter 207 is a filter that passes a light component of R (red), G (green), or B (blue), or a light component of C (cyan), M (magenta), or Y (yellow). Instead, the color filter 207 may be a filter (so-called white filter) that passes all light components of RGB or all light components of CMY, or may be a filter that passes IR (infrared light).

Each focus detection pixel 200 has the microlens 209 in the microlens layer 208. In this embodiment, a portion of the upper surface of the microlens layer 208, which has a portion projecting in the Z direction as the upper surface, will be referred to as one microlens. Hence, a flat portion and a portion where the gradient of the tangential plane of the upper surface of the microlens layer 208 changes form the boundary between two adjacent microlenses. The shape of the microlens 209 is symmetric with respect to a line (this line will be referred to as the central axis of the microlens 209 hereinafter) that passes through the top 209b of the microlens 209 and is parallel to the Z direction. The shape of the microlens 209 is also symmetric with respect to each of the planes PL1 and PL3.

To improve the stability of the filter film thickness, the image pickup apparatus 100 may include a planarization layer between the color filter layer 206 and the microlens layer 208. The microlens layer 208, the color filter layer 206, and the planarization layer are made of a material such as a resin.

The light guide 204 is embedded in the insulating layer 203 and arranged between the microlens 209 and the photoelectric conversion unit 202. The refractive index of the light guide 204 is higher than that of the insulating layer 203. For this reason, light that has passed through the color filter 207 and entered the light guide 204 from an upper surface 204a of the light guide 204 is confined in the light guide 204 and guided to the photoelectric conversion unit 202. The light guide 204 may be made of one material, or may be made of a plurality of materials. Comparison of refractive indices is done using, for example, absolute refractive indices. Since the refractive index depends on a frequency, the comparison may be done near the center of the wavelength of light that the color filter 207 passes. The refractive index of the light guide 204 may be the refractive index of the material that forms most of the light guide 204. This also applies to the refractive index of the insulating layer 203.

The shape of the microlens 209 will be described next with reference to FIGS. 3A to 3D. Upper surfaces 209a of the microlens 209 on the planes PL1 to PL3 (that is, the intersections between the upper surface 209a and the planes PL1 to PL3) will be referred to as upper surfaces 301 to 303, respectively. The edges of the upper surface 209a of the microlens 209 on the planes PL1 to PL3 will be referred to as edges 209c to 209e, respectively.

FIG. 3A shows the upper surfaces 301 to 303 in a superimposed state and also shows the light guide 204. The widths of the upper surfaces 301 to 303 are expressed as W1 to W3, respectively, and the width of the upper surface 204a of the light guide 204 is expressed as W4. The width is a length in a direction parallel to the upper surface 201a of the substrate 201. In this embodiment, since the upper surface 204a of the light guide 204 is circular, the widths W4 have the same value on the planes PL1 to PL3. In this embodiment, W1 to W4 meet a relationship W4<W1=W3<W2. That is, on each of the planes PL1, PL2, and PL3, the width of the microlens 209 is larger than the width of the upper surface 204a of the light guide 204. In addition, the width of the microlens 209 on the plane PL1 is equal to the width of the microlens 209 on the plane PL3, and smaller than the width of the microlens 209 on the plane PL2.

FIG. 3B is a view focusing on the upper surface 301. Since the upper surface 301 is symmetric with respect to the central axis of the microlens 209, FIG. 3B shows only a half. The section between the top 209b and the edge 209c of the microlens 209 is equally divided into four parts in terms of the distance along the upper surface 201a of the substrate 201. The thus obtained four portions are indicated by 301a to 301d sequentially from the side of the edge 209c. The upper surface of the portion 301a that is closest to the edge 209c is more moderate than the upper surface of the second portion 301b from the edge 209c. The upper surface of the second portion 301b from the edge 209c is steeper than the upper surface of the third portion 301c from the edge 209c. The upper surface of the third portion 301c from the edge 209c is steeper than the upper surface of the fourth portion 301d from the edge 209c.

For example, let $\phi 1$ be the representative value of the angle made by the upper surface of the portion 301a and a plane PL4 (that is, a plane parallel to the X-Y plane) parallel to the upper surface 201a of the substrate 201. The representative value of the angle made by the plane PL4 and the upper surface of the portion 301a is a value representing the angle made by the plane PL4 and the upper surface of the portion 301a, for example, the maximum value, minimum value, or average value of the angle made by the plane PL4 and the upper surface of the portion 301a, or a value at the center of the portion 301a. The average value of the angles made by the plane PL4 and the upper surface of the portion 301a may be the average value of two angles at the ends of the upper surface of the portion 301a, or may be the average value of angles at three or more positions on the upper surface of the portion 301a. This also applies to the representative values of the angles made by the plane PL4 and various portions of the microlens 209 to be described below. Let $\phi 4$ be the representative value of the angle made by the plane PL4 and the upper surface of the portion 301b. Since the upper surface of the portion 301a is more moderate than the upper surface of the portion 301b, $\phi 1 < \phi 4$ holds. For example, $5° \leq \phi 1 \leq 30°$, and $40° \leq \phi 4 \leq 60°$.

FIG. 3C is a view focusing on the upper surface 302. Since the upper surface 302 is symmetric with respect to the central axis of the microlens 209, FIG. 3C shows only a half. The section between the top 209b and the edge 209d of the microlens 209 is equally divided into four parts in terms of the distance along the upper surface 201a of the substrate 201. The thus obtained four portions are indicated by 302a to 302d sequentially from the side of the edge 209d. The upper surface of the portion 302a that is closest to the edge 209d is steeper than the upper surface of the second portion 302b from the edge 209d. The upper surface of the second portion 302b from the edge 209d is steeper than the upper surface of the third portion 302c from the edge 209d. The upper surface of the third portion 302c from the edge 209d is steeper than the upper surface of the fourth portion 302d from the edge 209d. For example, let $\phi 2$ be the representative value of the angle made by the plane PL4 and the upper surface of the portion 302a, and $\phi 5$ be the representative value of the angle made by the plane PL4 and the upper surface of the portion 302b. Since the upper surface of the portion 302a is steeper than the upper surface of the portion 302b, $\phi 2 > \phi 5$ holds. For example, $40° \leq \phi 2 \leq 60°$, and $30° \leq \phi 5 \leq 40°$.

FIG. 3D is a view focusing on the upper surface 303. Since the upper surface 303 is symmetric with respect to the central axis of the microlens 209, FIG. 3D shows only a half. The section between the top 209b and the edge 209e of the microlens 209 is equally divided into four parts in terms of the distance along the upper surface 201a of the substrate 201. The thus obtained four portions are indicated by 303a to 303d sequentially from the side of the edge 209e. The upper surface of the portion 303a that is closest to the edge 209e is steeper than the upper surface of the second portion 303b from the edge 209e. The upper surface of the second portion 303b from the edge 209e is steeper than the upper surface of the third portion 303c from the edge 209e. The upper surface of the third portion 303c from the edge 209e is steeper than the upper surface of the fourth portion 303d from the edge 209e. For example, let ϕ3 be the representative value of the angle made by the plane PL4 and the upper surface of the portion 303a, and ϕ6 be the representative value of the angle made by the plane PL4 and the upper surface of the portion 303b. Since the upper surface of the portion 303a is steeper than the upper surface of the portion 303b, ϕ3>ϕ6 holds. For example, $50° \leq \phi3 \leq 80°$, and $30° \leq \phi6 \leq 50°$.

Additionally, in this embodiment, a portion near the edge 209c out of the upper surface 301 of the microlens 209 on the plane PL1 is more moderate than a portion near the edge 209d out of the upper surface 302 of the microlens 209 on the plane PL2. That is, ϕ1<ϕ2 is met. The portion near the edge may be the portion closest to the edge out of the four portions obtained by equally dividing the microlens into four parts, as described above. In addition, ϕ1<(½)×ϕ2 may be met. A portion near the edge 209e out of the upper surface 303 of the microlens 209 on the plane PL3 is steeper than a portion near the edge 209d out of the upper surface 302 of the microlens 209 on the plane PL2. That is, ϕ2<ϕ3 is met.

Figure 4:
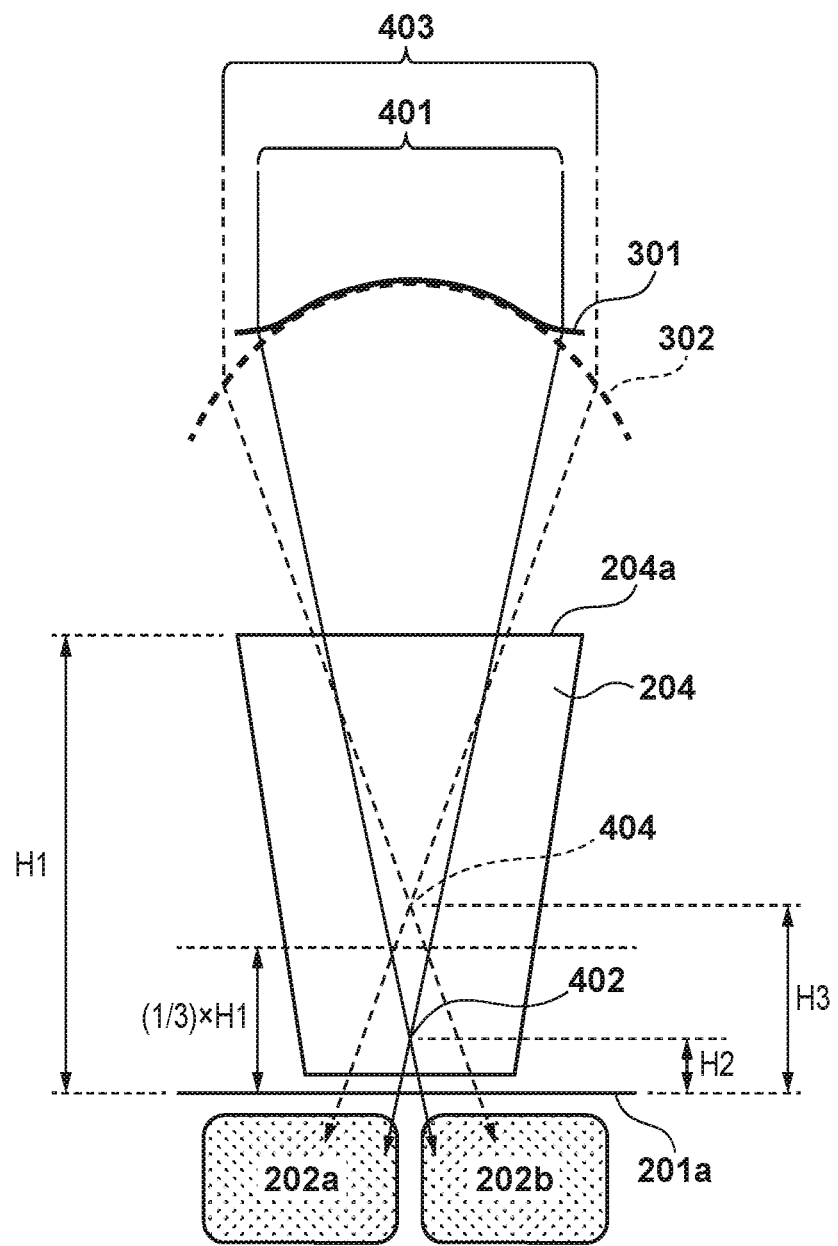
FIG. 4 is a view for explaining the characteristic of the microlens shown in FIGS. 3A to 3D.

Condensing of the microlens 209 will be described next with reference to FIG. 4. FIG. 4 is a view showing the focus detection pixel 200 on the plane PL1 and that on the plane PL2 in a superimposed state. Some elements are not illustrated in FIG. 4. Although the size of the photoelectric conversion unit 202 is different between the plane PL1 and the plane PL2, FIG. 4 shows it in the same size. Of light that enters from a direction (that is, the Z direction) perpendicular to the upper surface 201a of the substrate 201, light 401 that enters a portion near the edge of the upper surface 301 condenses to a point 402 at a height H2 from the upper surface of the substrate 201. On the other hand, of the light that enters from the direction perpendicular to the upper surface 201a of the substrate 201, light 403 that enters a portion near the edge of the upper surface 302 condenses to a point 404 at a height H3 from the upper surface of the substrate 201. Since ϕ1<ϕ2 is met, H2<H3. That is, the refracting power of the microlens 209 on the plane PL1 is smaller than the refracting power of the microlens 209 on the plane PL2. The refracting power of the microlens means a force that bends a light beam that has entered the microlens, and is sometimes called the power of the microlens. Letting H1 be the height of the upper surface 204a of the light guide 204 from the upper surface 201a of the substrate 201, H2<(⅓)×H1<H3 may be met. That is, the light 401 that enters the portion near the edge of the upper surface 301 may condense on the substrate side at a height smaller than ⅓ the height H1, and the light 403 that enters the portion near the edge of the upper surface 302 may condense on the microlens side at a height larger than ⅓ the height H1.

Figure 5A:
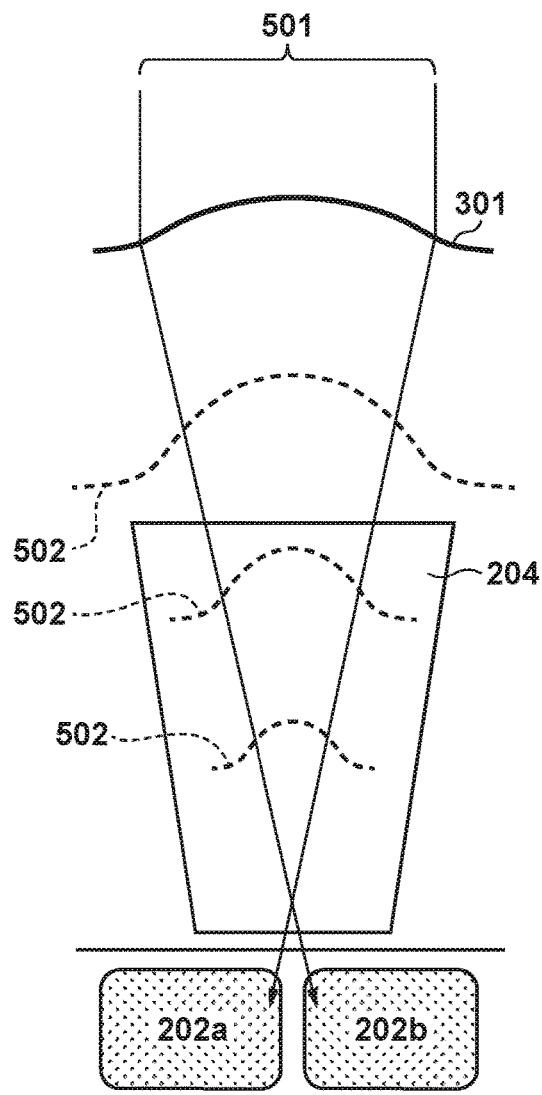
FIGS. 5A and 5B are views for explaining the characteristic of the microlens shown in FIGS. 3A to 3D.
Figure 5B:
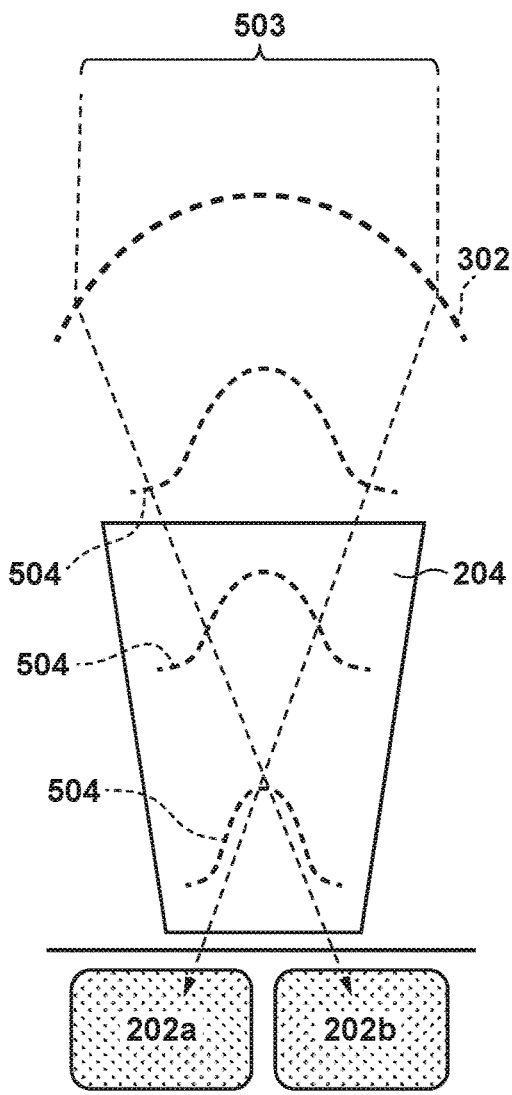

The sensitivity of the focus detection pixel 200 will be described next with reference to FIGS. 5A and 5B. FIG. 5A shows the focus detection pixel 200 on the plane PL1, and FIG. 5B shows the focus detection pixel 200 on the plane PL2. Some elements are not illustrated in FIGS. 5A and 5B. Light 501 that enters the upper surface 301 of the microlens 209 condenses while having a wavy spread by the diffraction effect, as indicated by a waveform 502. Similarly, light 503 that enters the upper surface 302 of the microlens 209 condenses while having a wavy spread by the diffraction effect, as indicated by a waveform 504. Since the refracting power of the microlens 209 on the plane PL1 is smaller than the refracting power of the microlens 209 on the plane PL2, the waveform 502 is wider than the waveform 504. For this reason, some components of the light 501 do not enter the light guide 204, but most components of the light 503 enter the light guide 204. Hence, the shape of the upper surface 302 of the microlens 209 attains higher sensitivity of the focus detection pixel 200 than the shape of the upper surface 301 of the microlens 209.

Figure 6:
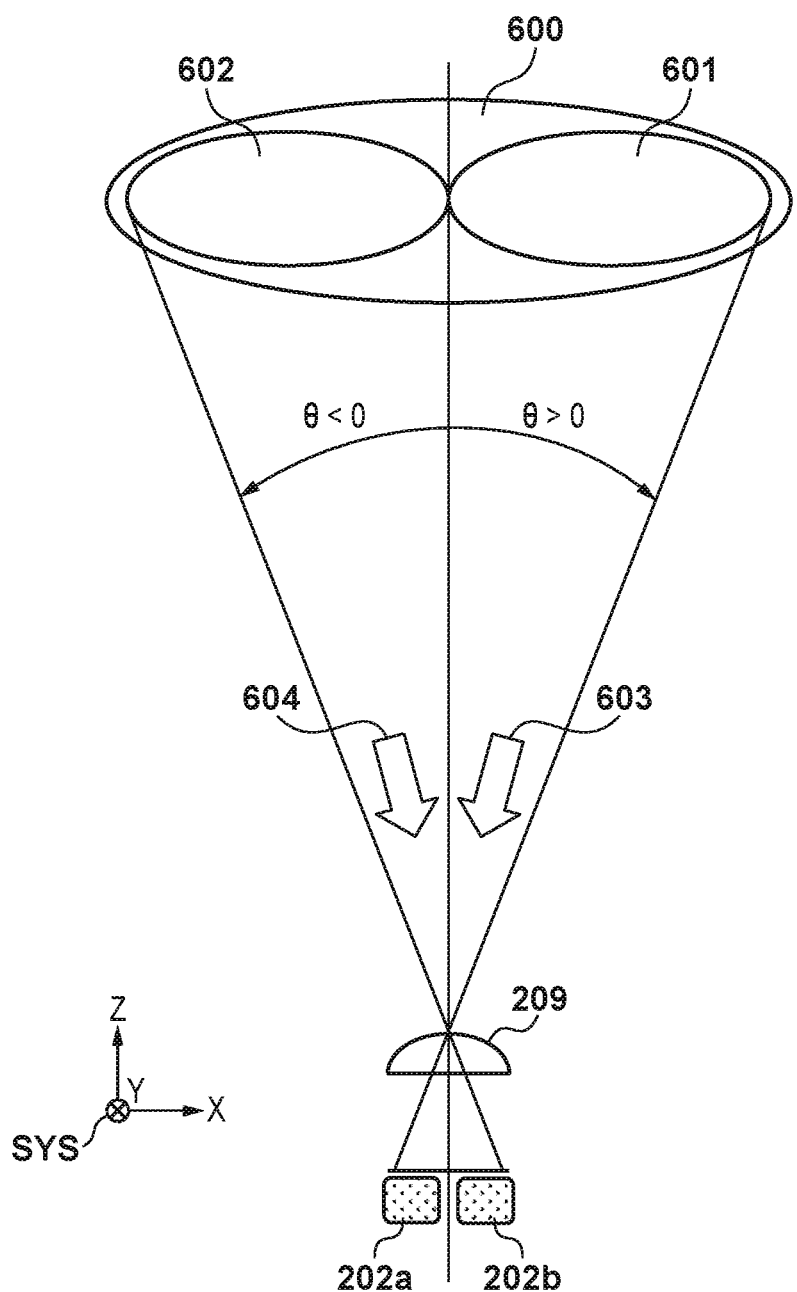
FIG. 6 is a view for explaining the characteristic of the microlens shown in FIGS. 3A to 3D.

The principle of focus detection by the focus detection pixel 200 will be described next with reference to FIG. 6. FIG. 6 explains the positional relationship between an exit pupil 600 of an imaging optical system, the microlens 209, and the photoelectric conversion regions 202a and 202b. The exit pupil 600 includes two pupil regions 601 and 602. The angle of incidence of light that enters from the exit pupil 600 is represented by θ. If the light exists clockwise with respect to the Z direction, θ is positive. If the light exists counterclockwise, θ is negative. Light 603 (that is, light with the angle θ of incidence>0) that enters from the pupil region 601 passes through the microlens 209 and enters the photoelectric conversion region 202a. Light 604 (that is, light with the angle θ of incidence<0) that enters from the pupil region 602 passes through the microlens 209 and enters the photoelectric conversion region 202b. Focus detection is performed by measuring the phase difference between the light 603 and the light 604.

Figure 7A:
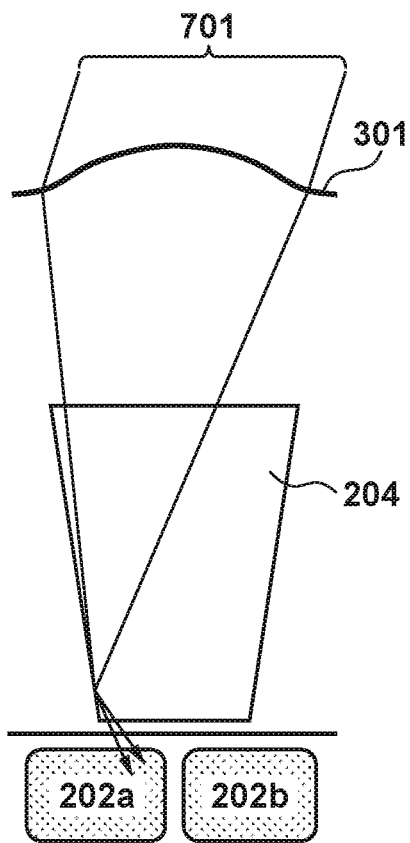
FIGS. 7A to 7D are views for explaining the characteristic of the microlens shown in FIGS. 3A to 3D.
Figure 7B:
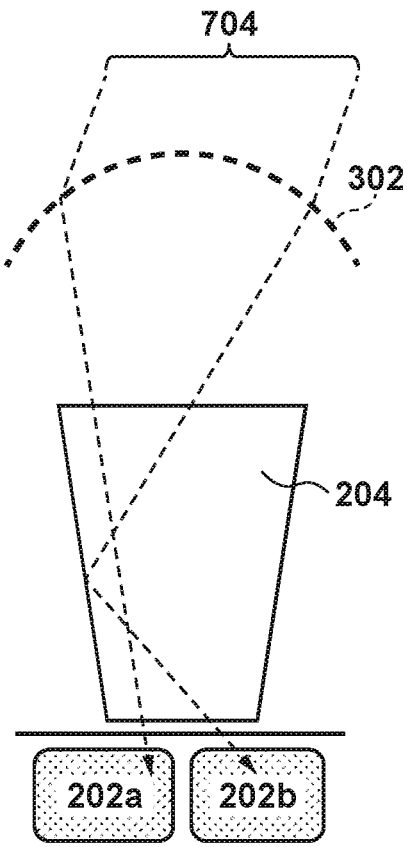
Figure 7C:
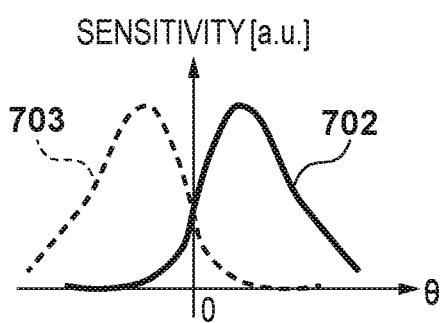
Figure 7D:
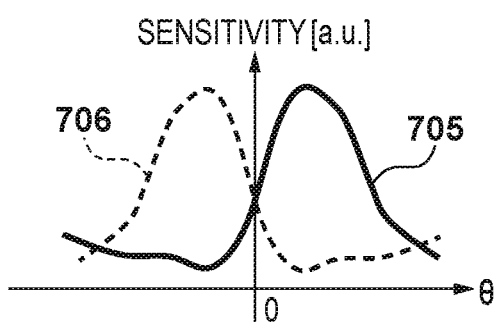
Figure 8A:
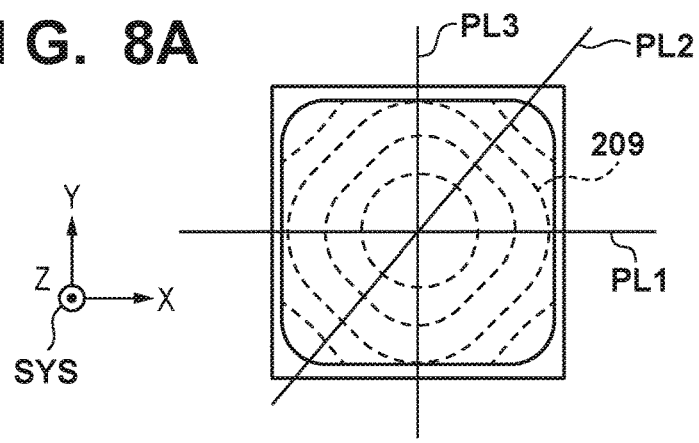
FIGS. 8A to 8D are views for explaining a modification of the focus detection pixel shown in FIGS. 2A to 2C.
Figure 8B:
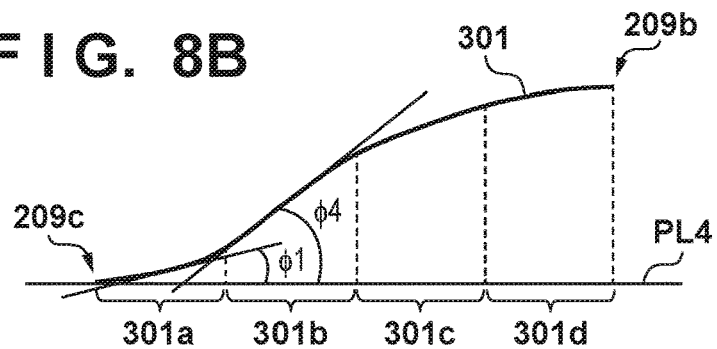
Figure 8C:
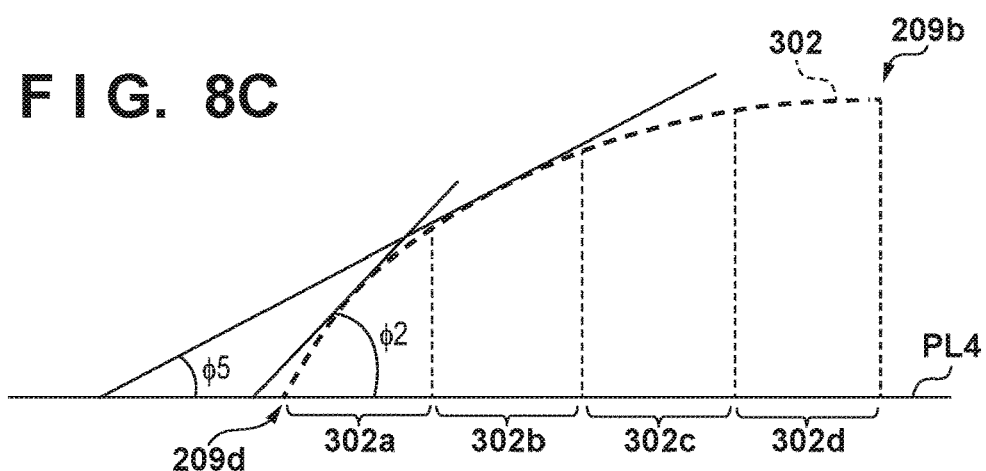
Figure 8D:
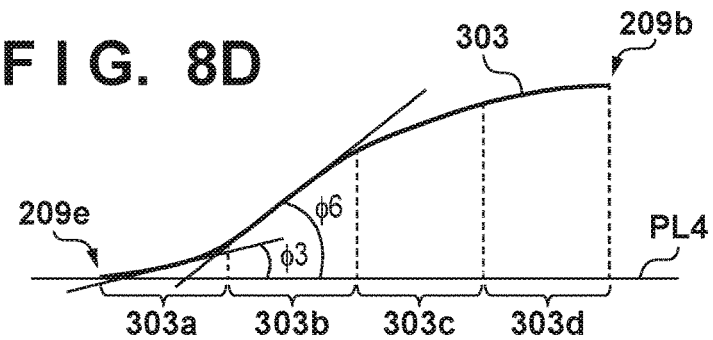
Figure 9A:
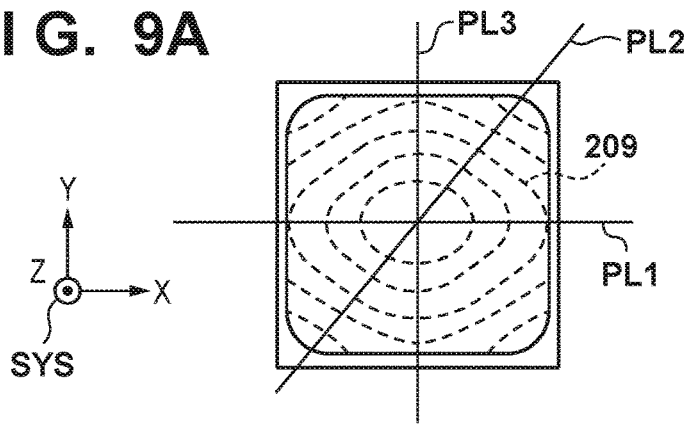
FIGS. 9A to 9D are views for explaining another modification of the focus detection pixel shown in FIGS. 2A to 2C.
Figure 9B:
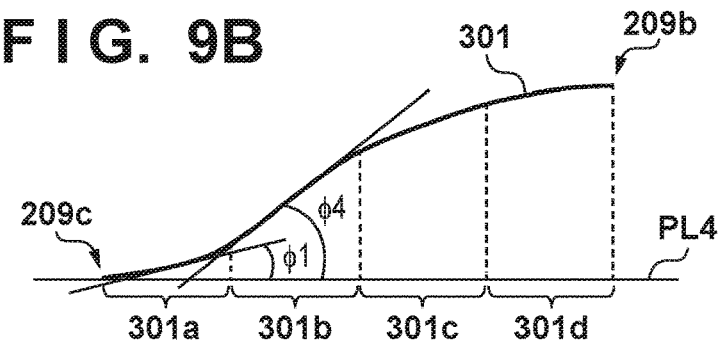
Figure 9C:
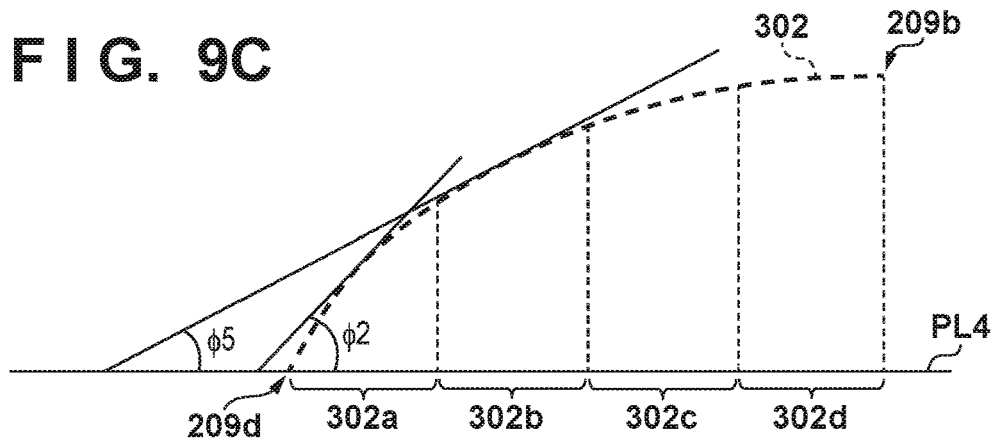
Figure 9D:
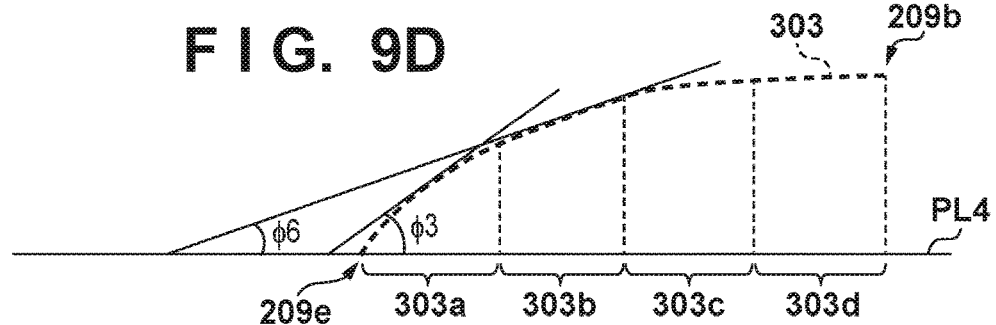

Accuracy of focus detection by the focus detection pixel 200 will be described next with reference to FIGS. 7A to 7D. FIG. 7A shows the focus detection pixel 200 on the plane PL1, and FIG. 7B shows the focus detection pixel 200 on the plane PL2. Some elements are not illustrated in FIGS. 7A to 7D. FIGS. 7C and 7D show the relationship between the angle θ of incidence described with reference to FIG. 6 and the sensitivity of the photoelectric conversion unit 202. In FIG. 7C, a graph 702 shows the sensitivity of the photoelectric conversion region 202a to the light that enters the upper surface 301 of the microlens 209, and a graph 703 shows the sensitivity of the photoelectric conversion region 202b to the light that enters the upper surface 301 of the microlens 209. In FIG. 7D, a graph 705 shows the sensitivity of the photoelectric conversion region 202a to the light that enters the upper surface 302 of the microlens 209, and a graph 706 shows the sensitivity of the photoelectric conversion region 202b to the light that enters the upper surface 302 of the microlens 209. The unit of the sensitivity is arbitrary.

The refracting power of the microlens 209 on the plane PL1 is smaller than the refracting power of the microlens 209 on the plane PL2, as described above with reference to FIG. 4. For this reason, the condensing point of light 701 that obliquely enters the upper surface 301 is located closer to the substrate 201 than the condensing point of light 704 that obliquely enters the upper surface 302. Hence, the ratio of light components of light with the angle θ>0, which enter the photoelectric conversion region 202b and serve as a false signal is lower in the light 701 that enters the upper surface 301 than in the light 704 that enters the upper surface 302. Hence, the shape of the upper surface 301 of the microlens 209 attains higher accuracy of focus detection of the focus detection pixel 200 than the shape of the upper surface 302 of the microlens 209.

The upper surface 301 of the microlens 209 is located along the direction (X direction) to perform focus detection, but the upper surface 302 of the microlens 209 intersects the direction to perform focus detection. For this reason, the light that enters the upper surface 301 of the microlens 209 hardly generates a false signal as compared to the light that enters the upper surface 302 of the microlens 209. Hence, in this embodiment, the shape of the upper surface 301 of the microlens 209 gives priority to the focus detection accuracy. The width of the upper surface 302 of the microlens 209 is larger than the width of the upper surface 301 of the microlens 209. For this reason, the upper surface 302 of the microlens 209 receives more light than the upper surface 301 of the microlens 209. Hence, in this embodiment, the shape of the upper surface 302 of the microlens 209 gives priority to the sensitivity. In this embodiment, improvement of focus detection accuracy and improvement of sensitivity in the focus detection pixel 200 are simultaneously attained in this way.

In this embodiment, the microlens 209 has a shape symmetric with respect to the plane PL3, and the photoelectric conversion regions 202a and 202b and the gate electrodes 210a and 210b have shapes symmetric with respect to the plane PL3'. Hence, the sensitivity to incident light is symmetric with respect to θ=0. In addition, since the gate electrodes 210a and 210b are located at the ends of the photoelectric conversion regions 202a and 202b, the ratio of light lost by the gate electrodes 210a and 210b is reduced.

A modification of the focus detection pixel 200 will be described next with reference to FIGS. 8A to 8D. In this modification, the structure of the microlens 209 is different from that in the above-described embodiment. The difference will mainly be described below, and a description of portions that can be the same will be omitted. FIGS. 8A to 8D correspond to FIG. 2C and FIGS. 3B to 3D, respectively. In the modification shown in FIGS. 8A to 8D, the upper surface 301 of the microlens 209 on the plane PL1 and the upper surface 303 of the microlens 209 on the plane PL3 have the same shape. Hence, for various angles defined above, $\phi1<\phi4$, $\phi2<\phi5$, $\phi3<\phi6$, $\phi1=\phi3<\phi2$, $W4<W1=W3<W2$ are met. In this modification, the shape of the upper surface 303 having a width smaller than that of the upper surface 302 of the microlens 209 gives priority to the focus detection accuracy. That is, the refracting power of the microlens 209 on the plane PL3 is smaller than the refracting power of the microlens 209 on the plane PL2.

Another modification of the focus detection pixel 200 will be described next with reference to FIGS. 9A to 9D. In this modification, the structure of the microlens 209 is different from that in the above-described embodiment. The difference will mainly be described below, and a description of portions that can be the same will be omitted. FIGS. 9A to 9D correspond to FIG. 2C and FIGS. 3B to 3D, respectively. In the modification shown in FIGS. 9A to 9D, for various angles defined above, $\phi1<\phi4$, $\phi2<\phi5$, $\phi3>\phi6$, $\phi1<\phi3<\phi2$, $W4<W1=W3<W2$ are met. In this modification, the shape of the upper surface 303 having a width smaller than that of the upper surface 302 of the microlens 209 gives priority to the sensitivity. That is, the refracting power of the microlens 209 on the plane PL3 is larger than the refracting power of the microlens 209 on the plane PL2. In this modification, $\phi2=\phi3$ may hold.

Figure 10A:
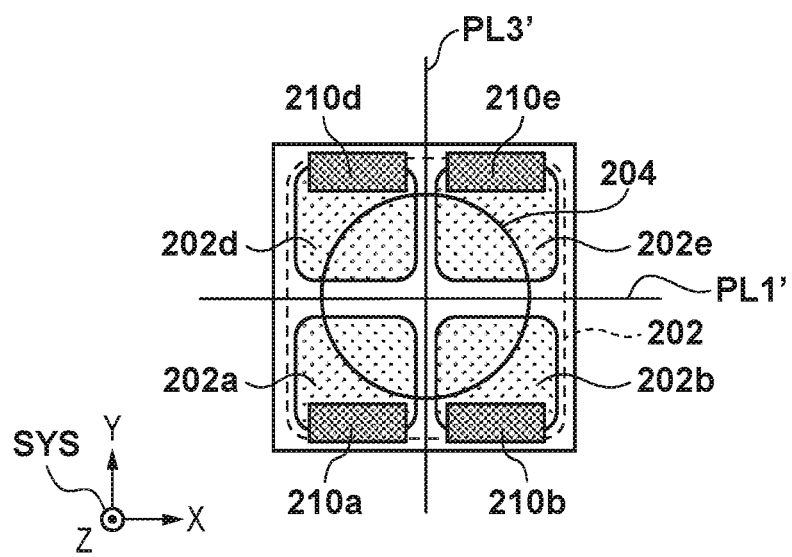
FIGS. 10A and 10B are views for explaining still another modification of the focus detection pixel shown in FIGS. 2A to 2C.
Figure 10B:
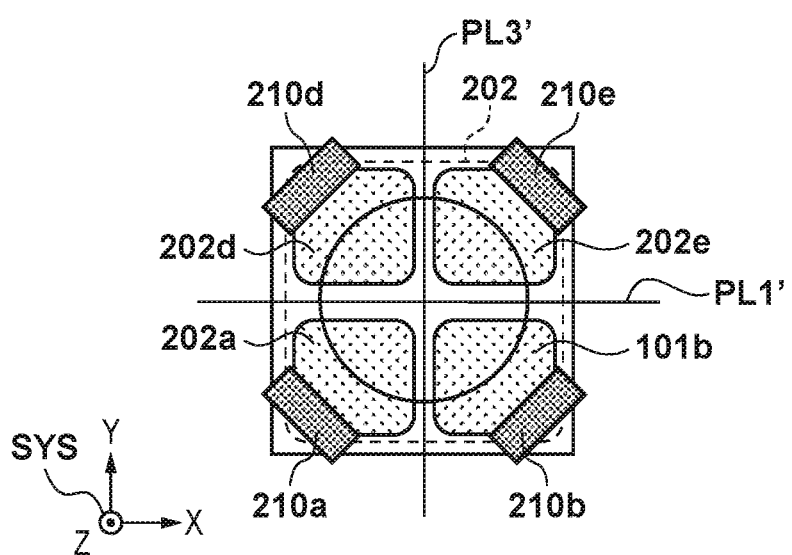

Still another modification of the focus detection pixel 200 will be described next with reference to FIGS. 10A and 10B. In this modification, the structures of the photoelectric conversion unit and the gate electrodes are different from those in the above-described embodiment. The differences will mainly be described below, and a description of portions that can be the same will be omitted. The shape of the microlens 209 may be one of the shapes described in the above modifications. Both FIGS. 10A and 10B correspond to FIG. 2B. In the modification, the photoelectric conversion unit 202 includes four photoelectric conversion regions 202a, 202b, 202d, and 202e, which are electrically separated from each other. The set of the photoelectric conversion regions 202a and 202d and the set of the photoelectric conversion regions 202b and 202e are arranged in the X direction. The set of the photoelectric conversion regions 202a and 202b and the set of the photoelectric conversion regions 202d and 202e are arranged in the Y direction. Hence, focus detection can be done in both the X and Y directions using the focus detection pixel 200 of this modification. The shape of the photoelectric conversion unit 202 is symmetric with respect to each of the planes PL1' and PL3'.

The shapes of the gate electrodes 210a, 210b, 210d, and 210e are symmetric with respect to each of the planes PL1' and PL3'. In the modification shown in FIG. 10A, the gate electrodes 210a and 210b are located along one side of the focus detection pixel 200, and the gate electrodes 210d and 210e are located along the opposite side of the focus detection pixel 200. In the modification shown in FIG. 10B, the gate electrodes 210a, 210b, 210d, and 210e are located at the four corners of the focus detection pixel 200.

Figure 11A:
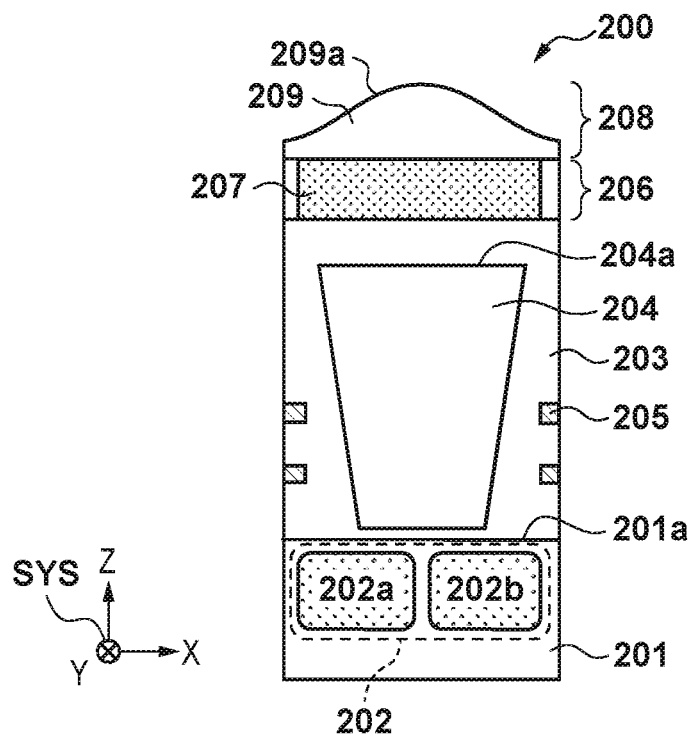
FIGS. 11A and 11B are views for explaining yet another modification of the focus detection pixel shown in FIGS. 2A to 2C.
Figure 11B:
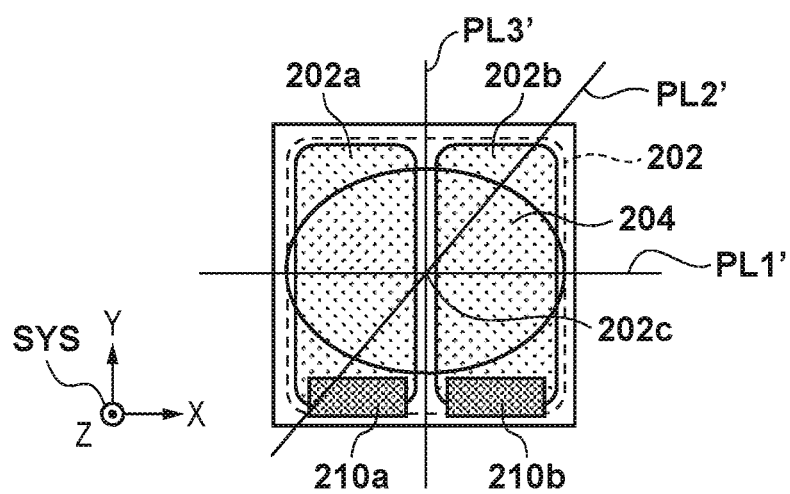

Yet another modification of the focus detection pixel 200 will be described next with reference to FIGS. 11A and 11B. In this modification, the shape of the light guide 204 is different from that in the above-described embodiment. The difference will mainly be described below, and a description of portions that can be the same will be omitted. The shape of the microlens 209 may be one of the shapes described in the above modifications. FIGS. 11A and 11B correspond to FIGS. 2A and 2B. Both the upper surface 204a of the light guide 204 and the section of the light guide 204 taken along a plane parallel to the upper surface 201a of the substrate 201 are elliptic. The major axis of the ellipse is located on the plane PL1', and the minor axis is located on the plane PL3'. For this reason, the width of the upper surface 204a of the light guide 204 on the plane PL1' is larger than the width of the upper surface 204a of the light guide 204 on the plane PL3'. As described above, in the focus detection pixel 200, the shape of the upper surface 301 having a width smaller than that of the upper surface 302 of the microlens 209 gives priority to the focus detection accuracy. Hence, in this modification, the width of the upper surface 204a of the light guide 204 on the plane PL1' is made larger, thereby suppressing a decrease in the sensitivity of the focus detection pixel 200. In this modification as well, the width of the microlens 209 on the plane PL1 is larger than the width of the upper surface 204a of the light guide 204 on the plane PL1', and the width of the microlens 209 on the plane PL3 is larger than the width of the upper surface 204a of the light guide 204 on the plane PL3'.

An imaging pixel 1200 provided in the image pickup apparatus 100 according to some embodiments will be described next with reference to FIGS. 12A to 12D. The imaging pixel 1200 is different from the focus detection pixel 200 in that a microlens 1209 is provided in place of the microlens 209, and the photoelectric conversion unit 202 is formed from one region, and the rest can be the same. The differences will mainly be described below, and a description of portions that can be the same will be omitted. The photoelectric conversion unit 202 provided in the image pickup apparatus 100 may be called an imaging photoelectric conversion unit, and the microlens 1209 provided in the image pickup apparatus 100 may be called an imaging microlens. FIGS. 12A to 12D correspond to FIGS. 2A, 2B, 3B, and 2C, respectively. The upper surface of the microlens 1209 on the plane PL1 that passes through a top 1209b of the microlens 1209 and is perpendicular to the upper surface 201a of the substrate 201 is represented by an upper surface 1209a. The plane PL1 of the imaging pixel 1200 is coincident with or parallel to the plane PL1 of the focus detection pixel 200. As shown in FIG. 12D, the contour lines on the upper surface of the microlens 1209 are concentric with respect to the top 1209b as the center.

Figure 12A:
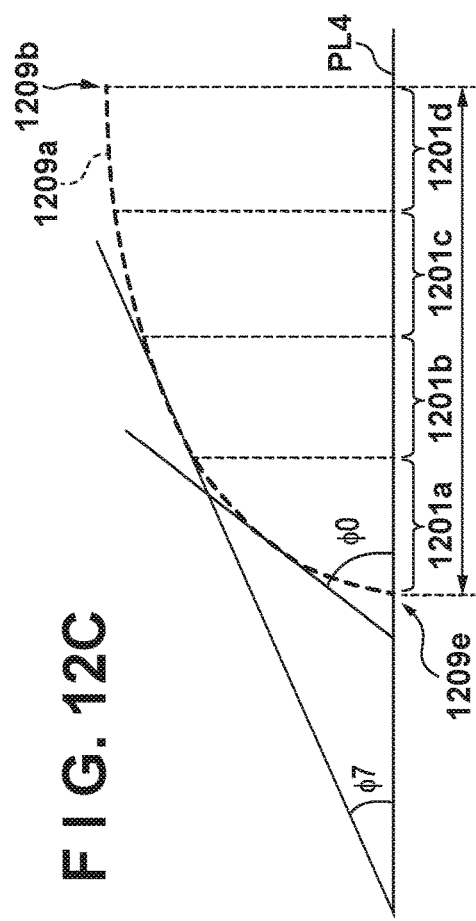
FIGS. 12A to 12D are views for explaining an example of the arrangement of an imaging pixel according to some embodiments.
Figure 12B:
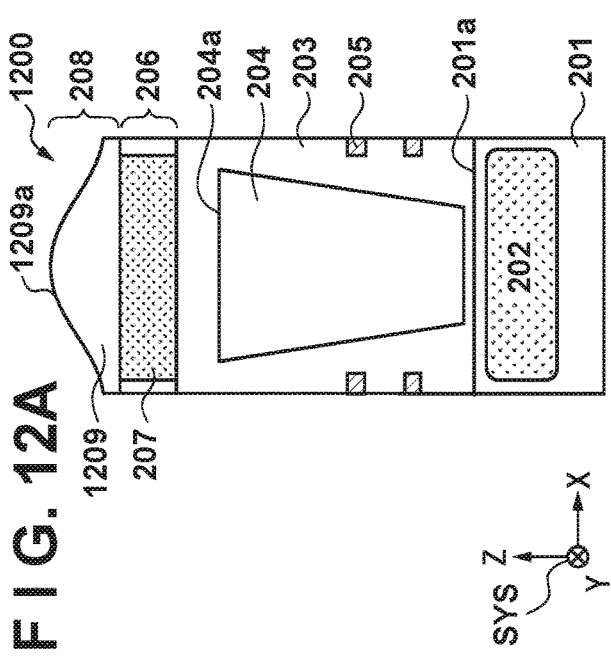
Figure 12C:
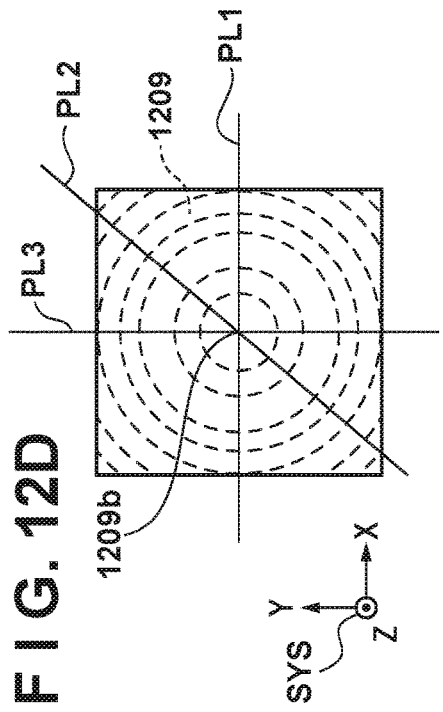
Figure 12D:
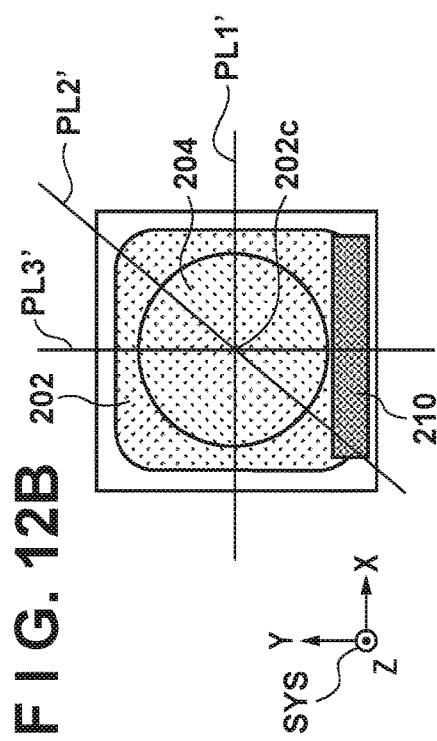

As shown in FIG. 12C, the section between the top 1209b and an edge 1209e of the microlens 1209 is equally divided into four parts in terms of the distance along the upper surface 201a of the substrate 201. The thus obtained four portions are indicated by 1201a to 1201d sequentially from the side of the edge 1209e. Since the focus detection accuracy need not be taken into consideration for the imaging pixel 1200, the microlens 1209 may have the above-described shape that gives priority to the sensitivity. For example, the upper surface of the portion 1201a that is closest to the edge 1209e is steeper than the upper surface of the second portion 1201b from the edge 1209e. The upper surface of the second portion 1201b from the edge 1209e is steeper than the upper surface of the third portion 1201c from the edge 1209e. The upper surface of the third portion 1201c from the edge 1209e is steeper than the upper surface of the fourth portion 1201d from the edge 1209e. For example, let φ0 be the representative value of the angle made by the plane PL4 and the upper surface of the portion 1201a, and φ7 be the representative value of the angle made by the plane PL4 and the upper surface of the portion 1201b. Since the upper surface of the portion 1201a is steeper than the upper surface of the portion 1201b, φ0>φ7 holds. In addition, φ0>φ1 may hold. That is, the slope of a portion near the edge out of the upper surface 1209a of the microlens 1209 on the plane PL1 may be steeper than the slope of a portion near the edge out of the upper surface 301 of the microlens 209 on the plane PL1. That is, the refracting power of the microlens 1209 on the plane PL1 may be smaller than the refracting power of the microlens 209 on the plane PL1.

In the above-described embodiment and various modifications, the top 209b of the microlens 209 and the center 202c of the photoelectric conversion unit 202 exist at positions that overlap in the Z direction. Instead, the top 209b of the microlens 209 and the center 202c of the photoelectric conversion unit 202 may be shifted from each other. For example, the top 209b of the microlens 209 may be shifted toward the center of the imaging region 101 by an amount corresponding to the distance from the center of the imaging region 101 to the focus detection pixel 200. By shifting the top in this way, the sensitivity and the focus detection accuracy of the focus detection pixel 200 arranged near the outer periphery of the imaging region 101 can be improved. Instead, the entire microlens layer 208 may be shifted with respect to the substrate 201. For example, when the microlens layer 208 is shifted in the Y direction, the ratio of light lost by the gate electrode 210 can be reduced. The microlens 209 or the microlens layer 208 may be shifted, and simultaneously, the light guide 204 may be shifted with respect to the photoelectric conversion unit 202.

The above-described microlens layer 208 can be formed by, for example, photolithography. For example, to form the microlens layer 208, a positive photosensitive resist is applied to the upper surface of the color filter layer 206 by spin coating. The resist is exposed and developed using a patterned photomask, thereby forming the microlens layer 208 including the microlens 209. The photomask may be an area coverage modulation mask that controls the transmittance based on the density of a fine dot pattern. The microlens 209 having the above-described shape can be formed by adjusting the transmittance distribution of the area coverage modulation mask.

An image pickup apparatus according to some embodiments will be described next with reference to FIGS. 13A to 13D. The image pickup apparatus includes focus detection pixels 1300a and 1300b. The focus detection pixels 1300a and 1300b are different from the focus detection pixel 200 in that the structures of the photoelectric conversion unit and the gate electrode are different, and light shielding portions 1301a and 1301b are further provided. The differences will mainly be described below, and a description of portions that can be the same will be omitted. The shape of the microlens 209 may be one of the shapes described in the above modifications. Both FIGS. 13A and 13C correspond to FIG. 2A, and both FIGS. 13B and 13D correspond to FIG. 2B.

In the focus detection pixel 1300a, the photoelectric conversion unit 202 is formed from one region, and one gate electrode 210 is arranged for this one region. The shape of the photoelectric conversion unit 202 is symmetric with respect to each of the planes PL1' and PL3'. The shape of the gate electrode 210 is symmetric with respect to the plane PL3'.

The light shielding portion 1301a is arranged between the photoelectric conversion unit 202 and the light guide 204. The light shielding portion 1301a is made of, for example, a metal. The light shielding portion 1301a may be formed in the same layer as the wiring pattern 205. The light shielding portion 1301a covers part of the photoelectric conversion unit 202. In the example shown in FIG. 13A, the light shielding portion 1301a covers the left half of the photoelectric conversion unit 202 but does not cover the right half of the photoelectric conversion unit 202. In the photoelectric conversion unit 202, the portion covered by the light shielding portion 1301a and the portion not covered are located on the opposite sides with respect to the plane PL3'. Light whose angle θ of incidence (FIG. 6) is positive is reflected by the light shielding portion 1301a, and therefore does not enter the photoelectric conversion unit 202. On the other hand, light whose angle θ of incidence is negative enters the photoelectric conversion unit 202.

The focus detection pixel 1300b is different from the focus detection pixel 1300a in that the light shielding portion 1301b covers the right half of the photoelectric conversion unit 202 but does not cover the left half of the photoelectric conversion unit 202, and the rest can be the same. Focus detection by a phase difference method is performed using the focus detection pixels 1300a and 1300b.

As an application example of the image pickup apparatus according to the above-described embodiment, a camera incorporating the image pickup apparatus will exemplarily be described. The concept of the camera includes not only apparatuses mainly aiming at shooting but also apparatuses (for example, a personal computer, a portable terminal, or a vehicle) having an auxiliary shooting function. The camera may be a module component such as a camera head. The camera includes the image pickup apparatus according to the present invention exemplarily described in the above embodiment, and a signal processing unit that processes a signal output from the image pickup apparatus. The signal processing unit can include, for example, a processor that processes digital data based on the signal obtained by the image pickup apparatus. An A/D converter configured to generate the digital data may be provided on the semiconductor substrate of the image pickup apparatus or on another semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-246633, filed Dec. 17, 2015 which is hereby incorporated by reference herein in its entirety.

What is claimed is:

1. An image pickup apparatus including a focus detection pixel configured to perform focus detection by a phase difference method,
    wherein the focus detection pixel comprises:
    a photoelectric conversion unit arranged in a substrate;
    a microlens arranged above the photoelectric conversion unit; and
    a light guide arranged between the photoelectric conversion unit and the microlens,
    wherein a refracting power of the microlens on a first plane is smaller than a refracting power of the microlens on a second plane,
    the first plane passes through a top of the microlens, is perpendicular to an upper surface of the substrate, and is located along a direction in which the focus detection pixel performs the focus detection, and
    the second plane passes through the top of the microlens, is perpendicular to the upper surface of the substrate, and intersects the first plane.

2. The apparatus according to claim 1, wherein a portion near an edge out of an upper surface of the microlens on the first plane is more moderate than a portion near an edge out of the upper surface of the microlens on the second plane.

3. The apparatus according to claim 1, wherein of four portions obtained by equally dividing a section between the top and an edge of the microlens on the first plane into four parts in terms of a distance along the upper surface of the substrate, an upper surface of a portion that is closest to the edge is more moderate than an upper surface of a second portion from the edge, and
    of four portions obtained by equally dividing a section between the top and an edge of the microlens on the second plane into four parts in terms of the distance along the upper surface of the substrate, an upper surface of a portion that is closest to the edge is steeper than an upper surface of a second portion from the edge.

4. The apparatus according to claim 1, wherein a width of the microlens on the first plane is smaller than the width of the microlens on the second plane.

5. The apparatus according to claim 1, wherein a width of the microlens on the first plane is larger than a width of an upper surface of the light guide on the first plane, and
    the width of the microlens on the second plane is larger than the width of the upper surface of the light guide on the second plane.

6. The apparatus according to claim 1, wherein light that enters a portion near an edge of an upper surface of the microlens on the first plane condenses on a side of the substrate at a height smaller than ⅓ a height of an upper surface of the light guide from the upper surface of the substrate, and
    light that enters a portion near the edge of the upper surface of the microlens on the second plane condenses on a side of the microlens at a height larger than ⅓ the height of the upper surface of the light guide from the upper surface of the substrate.

7. The apparatus according to claim 1, wherein letting $\phi 1$ be a representative value of an angle made by a portion near an edge out of an upper surface of the microlens on the first plane and a plane parallel to the upper surface of the substrate, and $\phi 2$ be a representative value of an angle made by a portion near the edge out of the upper surface of the microlens on the second plane and the plane parallel to the upper surface of the substrate, $\phi 1 < \phi 2$ is met.

8. The apparatus according to claim 7, wherein $\phi 1 < (½) \times \phi 2$ is further met.

9. The apparatus according to claim 1, wherein the second plane intersects a third plane that passes through the top of the microlens and is perpendicular to the upper surface of the substrate and the first plane.

10. The apparatus according to claim 9, wherein a shape of the microlens is symmetric with respect to the third plane.

11. The apparatus according to claim 9, wherein a portion near an edge out of the upper surface of the microlens on the third plane is steeper than a portion near the edge out of the upper surface of the microlens on the first plane.

12. The apparatus according to claim 9, wherein a portion near an edge out of the upper surface of the microlens on the third plane is more moderate than a portion near the edge out of the upper surface of the microlens on the second plane.

13. The apparatus according to claim 9, wherein a width of an upper surface of the light guide on the first plane is larger than the width of the upper surface of the light guide on the third plane.

14. The apparatus according to claim 1, wherein the photoelectric conversion unit includes a plurality of regions electrically separated from each other.

15. The apparatus according to claim 14, wherein the plurality of regions include a first region and a second region, and
    the first region and the second region are located on opposite sides with respect to a plane perpendicular to the first plane and the upper surface of the substrate.

16. The apparatus according to claim 1, wherein the focus detection pixel further comprises a light shielding portion that covers part of the photoelectric conversion unit.

17. The apparatus according to claim 16, wherein a portion covered by the light shielding portion and a portion that is not covered by the light shielding portion in the photoelectric conversion unit are located on opposite sides with respect to a plane perpendicular to the first plane and the upper surface of the substrate.

18. The apparatus according to claim 1, wherein the focus detection pixel further comprises a gate electrode of a transfer transistor configured to transfer charges generated in the photoelectric conversion unit, and a shape of the gate electrode is symmetric with respect to a plane perpendicular to the first plane and the upper surface of the substrate.

19. The apparatus according to claim 1, further comprising an imaging pixel configured to generate an image, wherein the imaging pixel comprises:

an imaging photoelectric conversion unit arranged on the substrate; and an imaging microlens arranged on the imaging photoelectric conversion unit, and wherein a portion near an edge out of an upper surface of the imaging microlens on a plane that passes through a top of the imaging microlens and is perpendicular to the upper surface of the substrate is steeper than a portion near an edge out of an upper surface of the microlens on the first plane.

20. A camera comprising:

an image pickup apparatus; and a signal processing unit configured to process a signal obtained by the image pickup apparatus, wherein the image pickup apparatus includes a focus detection pixel configured to perform focus detection by a phase difference method, wherein the focus detection pixel comprises:

a photoelectric conversion unit arranged in a substrate;

a microlens arranged above the photoelectric conversion unit; and a light guide arranged between the photoelectric conversion unit and the microlens, wherein a refracting power of the microlens on a first plane is smaller than a refracting power of the microlens on a second plane, the first plane passes through a top of the microlens, is perpendicular to an upper surface of the substrate, and is located along a direction in which the focus detection pixel performs the focus detection, and the second plane passes through the top of the microlens, is perpendicular to the upper surface of the substrate, and intersects the first plane.

* * * * *